(12) United States Patent
Mo et al.

(10) Patent No.: US 11,968,914 B2
(45) Date of Patent: *Apr. 23, 2024

(54) RESISTIVE RANDOM ACCESS MEMORY DEVICE

(71) Applicant: Taiwan Semiconductor Manufacturing Co., Ltd., Hsinchu (TW)

(72) Inventors: Chun-Chieh Mo, Kaohsiung (TW); Shih-Chi Kuo, Yangmei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,245

(22) Filed: Nov. 23, 2022

(65) Prior Publication Data

US 2023/0090628 A1    Mar. 23, 2023

Related U.S. Application Data

(63) Continuation of application No. 17/339,793, filed on Jun. 4, 2021, now Pat. No. 11,527,714, which is a continuation of application No. 16/869,340, filed on May 7, 2020, now Pat. No. 11,038,105, which is a continuation of application No. 16/163,986, filed on Oct. 18, 2018, now Pat. No. 10,680,172.

(60) Provisional application No. 62/585,453, filed on Nov. 13, 2017.

(51) Int. Cl.
  *H10N 70/00* (2023.01)
  *H10B 63/00* (2023.01)

(52) U.S. Cl.
  CPC ........... *H10N 70/841* (2023.02); *H10B 63/30* (2023.02); *H10N 70/021* (2023.02); *H10N 70/061* (2023.02); *H10N 70/8265* (2023.02); *H10N 70/8833* (2023.02); *H10N 70/8836* (2023.02)

(58) Field of Classification Search
  CPC ......... H10B 43/40; H10B 43/30; H01L 29/78; H01L 29/6656; H01L 29/792; H01L 29/40117
  See application file for complete search history.

(56) References Cited

U.S. PATENT DOCUMENTS

| 7,579,197 | B1 | 8/2009 | Li |
| 8,729,521 | B2 | 5/2014 | Lung et al. |
| 8,988,926 | B2 | 3/2015 | Pellizzer et al. |
| 2011/0291064 | A1 | 12/2011 | Marsh et al. |
| 2013/0058158 | A1 | 3/2013 | Pellizer et al. |
| 2015/0137059 | A1 | 5/2015 | Chen et al. |

(Continued)

FOREIGN PATENT DOCUMENTS

| KR | 1020130000428 A | 1/2013 |
| KR | 20150123740 A | 11/2015 |

(Continued)

*Primary Examiner* — Allison Bernstein
(74) *Attorney, Agent, or Firm* — Duane Morris LLP

(57) ABSTRACT

A memory cell includes: a resistive material layer comprising a first portion that extends along a first direction and a second portion that extends along a second direction, wherein the first and second directions are different from each other; a first electrode coupled to a bottom surface of the first portion of the resistive material layer; and a second electrode coupled to the second portion of the resistive material layer.

20 Claims, 16 Drawing Sheets

(56) References Cited

U.S. PATENT DOCUMENTS

2015/0311435 A1 10/2015 Liu et al.
2017/0207387 A1 7/2017 Yang et al.

FOREIGN PATENT DOCUMENTS

| KR | 1020170043495 A | 4/2017 |
| KR | 1020170085411 A | 7/2017 |

RESISTIVE RANDOM ACCESS MEMORY DEVICE

CROSS-REFERENCE TO RELATED APPLICATIONS

This application is a continuation of U.S. patent application Ser. No. 17/339,793, filed Jun. 4, 2021, which is a continuation of U.S. patent application Ser. No. 16/869,340, filed on May 7, 2020, now U.S. Pat. No. 11,038,105, which is a continuation of U.S. patent application Ser. No. 16/163,986, filed on Oct. 18, 2018, now U.S. Pat. No. 10,680,172, issued on Jun. 9, 2020, which claims priority to U.S. Provisional Patent Application No. 62/585,453, filed on Nov. 13, 2017, each of which is incorporated by reference herein in its entirety.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

As integrated circuits (ICs), which include such RRAM devices, become more powerful, it is desirable to maximize the number of the RRAM devices in the IC accordingly. Generally, an RRAM device includes a top electrode (e.g., an anode) and a bottom electrode (e.g., a cathode) with a variable resistive material layer interposed therebetween. Forming the RRAM device in such a stack configuration may encounter a limit in terms of maximizing the number of the RRAM devices in the IC because of various reasons. For example, an active area of the variable resistive material layer typically extends in parallel with the top/bottom electrodes, and the number of the RRAM devices is typically proportional to a number of such active areas. As such, within a given area of the IC, the number of RRAM devices that can be integrated is substantially limited. Thus, existing RRAM devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EMBODIMENTS

Figure 1A:
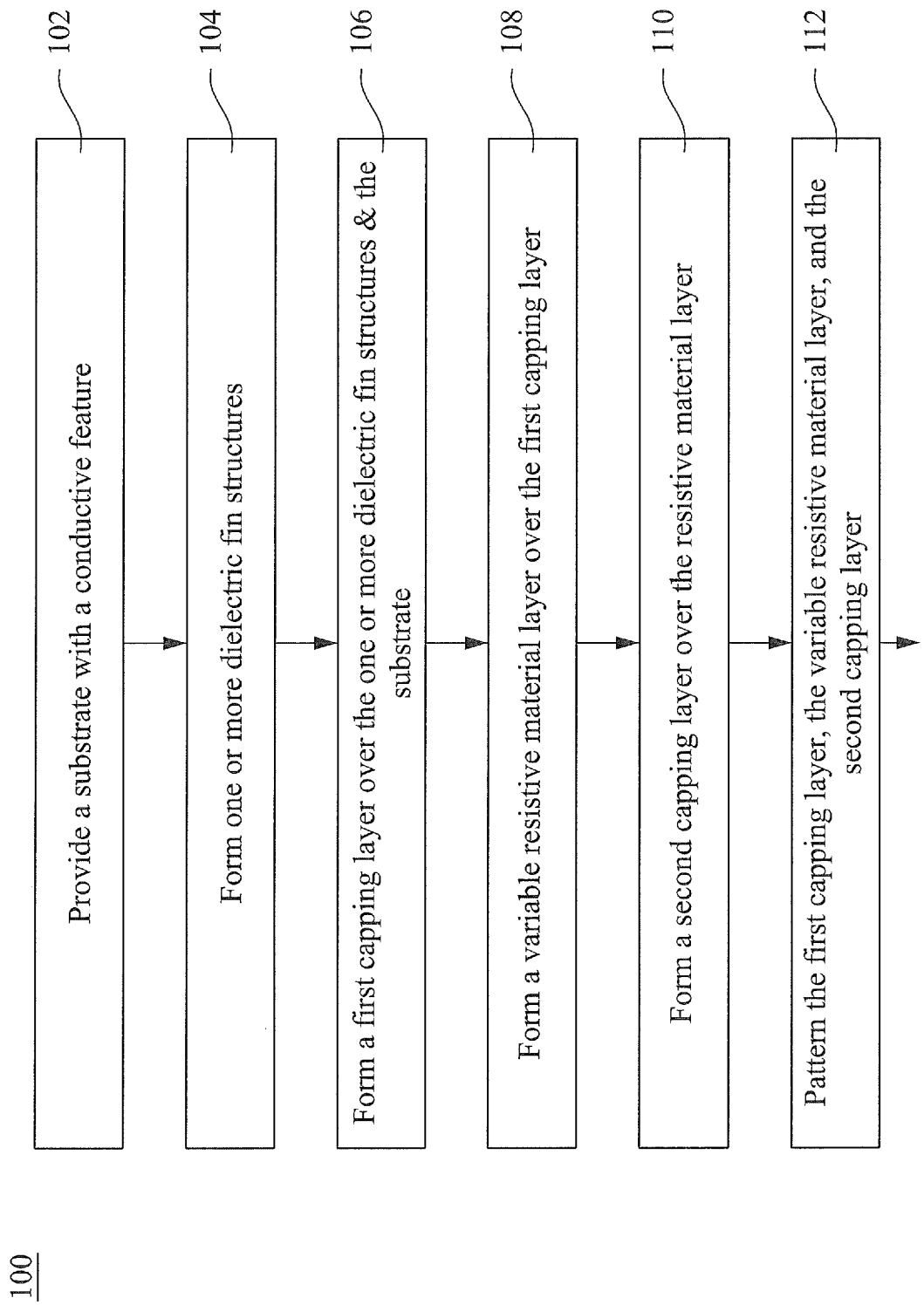
FIGS. 1A and 1B illustrate a flow chart of a method for forming a semiconductor device, in accordance with some embodiments.

The following disclosure describes various embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel RRAM device and methods to form the same. In some embodiments, the disclosed RRAM device includes a plurality of RRAM resistors, each of which includes an L-shaped variable resistive material layer. Forming such an L-shaped variable resistive material layer in each RRAM resistor may allow a respective active area of the variable resistive material layer to extend along at least two different directions. In other words, the variable resistive material layer may include at least two portions that each extends along respective directions. Accordingly, in some embodiments, each RRAM resistor's top and bottom electrodes may be coupled to respective different portions of the variable resistive material layer. As such, within a given area, a number of "integrable" RRAM resistors may be substantially increased.

Figure 1B:
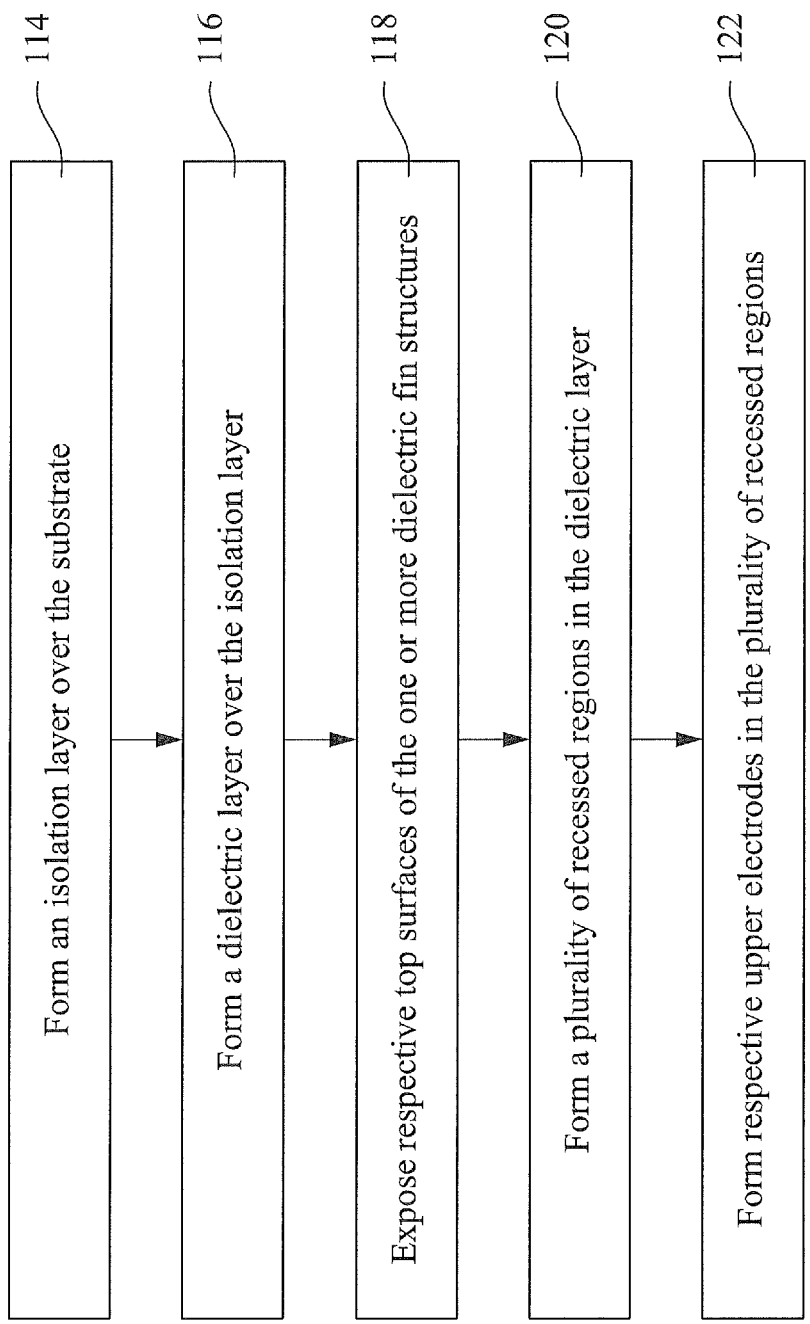

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, an RRAM device. As employed by the present disclosure, the RRAM device refers to any device including a variable resistive material layer. It is noted that the method 100 of FIGS. 1A and 1B does not produce a completed RRAM device. A completed RRAM device may be fabricated using complementary metal-oxide-semiconductor (CMOS) technology. Accordingly, it is understood that additional operations may be provided before, during, and after the method 100 of FIGS. 1A and 1B, and that some other operations may only be briefly described herein.

Referring first to FIG. 1A, in some embodiments, the method 100 starts with operation 102 in which a substrate with a conductive feature is provided. In some embodiments, the conductive feature may be a horizontal interconnection structure form of a metal material (e.g., copper (Cu)). In some embodiments, the conductive feature may serve as a common bottom electrode of a plurality of RRAM resistors of the RRAM device. The method 100 continues to operation 104 in which one or more dielectric fin structures are formed. In some embodiments, the one or more dielectric fin structures are formed on the conductive feature. Further, in some embodiments, each of the one or more dielectric fin structures extends along a vertical direction, perpendicular to a major surface of the conductive feature, such that a corner may be formed at an intersection of a sidewall of each dielectric fin structure and the major surface of the conductive feature.

The method 100 continues to operation 106 in which a first capping layer is formed over the one or more dielectric fin structures and the substrate. The method 100 continues to operation 108 in which a variable resistive material layer is formed over the first capping layer. The method 100 continues to operation 110 in which a second capping layer is formed over the variable resistive material layer. In some embodiments, the first capping layer, the variable resistive material layer, and the second capping layer, formed at operations 106, 108, and 110, respectively, are each substantially conformal and thin. As such, each of the first capping layer, the variable resistive material layer, and the second capping layer may follow a profile of the aforementioned corner (e.g., an L shape), which will be discussed in further detail below.

The method 100 continues to operation 112 in which the first capping layer, the variable resistive material layer, and the second capping layer are patterned. In some embodiments, during such a patterning operation, portions of the first capping layer, the variable resistive material layer, and the second capping layer that are directly coupled to the conductive feature and/or the substrate and disposed relatively farther from any of the one or more dielectric fin structures are removed. As such, the one or more dielectric fin structures, overlaid by respective portions of the first capping layer, the variable resistive material layer, and the second capping layer, are laterally spaced from one another. In other words, each of the one or more dielectric fin structures may be overlaid by respective "patterned" first capping layer, variable resistive material layer, and second capping layer. Furthermore, the patterned first capping layer, the variable resistive material layer, and the second capping layer are laterally spaced from one another.

Referring then to FIG. 1B, the method 100 continues to operation 114 in which an isolation layer is formed over the substrate. In some embodiments, the isolation layer overlays a portion of the major surface of the conductive feature that are re-exposed after the operation 112, and respective top surfaces of the "patterned" second capping layers. The method 100 continues to operation 116 in which a dielectric layer is formed over the isolation layer. In some embodiments, an optional anti-reflective coating (ARC) layer may be formed over the dielectric layer. The method 100 continues to operation 118 in which respective top surfaces of the one or more dielectric fin structures are exposed. In some embodiments, a polishing process (e.g., a chemical-mechanical polishing (CMP) process) may be performed on respective portions of the dielectric layer, the isolation layer, the second capping layer, the variable resistive material layer, and the first capping layer until the respective top surfaces of the one or more dielectric fin structures are exposed. The method 100 continues to operation 120 in which a plurality of recessed regions are formed within the dielectric layer. In some embodiments, a portion of each patterned second capping layer is exposed by one of the plurality of recessed regions, and each of the plurality of recessed regions is coupled to one patterned variable resistive material layer through a respective patterned second capping layer. The method 100 continues to operation 122 in which a plurality of upper electrodes are respectively formed in the recessed regions. In some embodiments, the upper electrodes are each formed by filling the respective recessed region with a conductive material (e.g., copper (Cu)). Accordingly, each upper electrode is coupled to one patterned variable resistive material layer through a respective patterned second capping layer. In some embodiments, after the operation 122, the plurality of RRAM resistors that share the conductive feature as the bottom electrode are formed, which will be discussed in further detail below.

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, 2J, and 2K, respectively. In some embodiments, the semiconductor device 200 may be an RRAM device. The RRAM device 200 may be included in a microprocessor, memory cell, and/or other integrated circuit (IC). Also, FIGS. 2A through 2K are simplified for a better understanding of the concepts of the present disclosure. For example, although the figures illustrate the RRAM device 200, it is understood the IC, in which the RRAM device 200 is formed, may include a number of other devices comprising resistors, capacitors, inductors, fuses, etc., which are not shown in FIGS. 2A through 2K, for purposes of clarity of illustration.

Figure 2A:
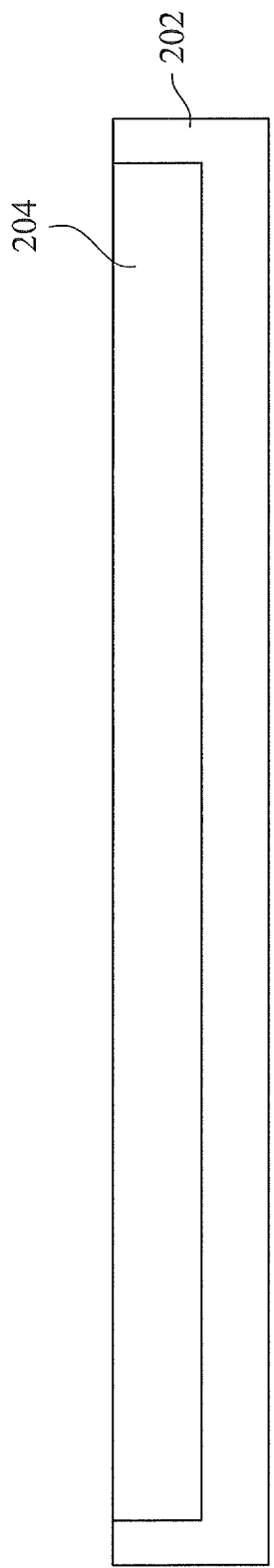
FIGS. 2A, 2B, 2C, 2D, 2E, 2F, 2G, 2H, 2I, 2J, and 2K illustrate cross-sectional views of a semiconductor device during various fabrication stages, made by the method of FIG. 1, in accordance with some embodiments.

Corresponding to operation 102 of FIG. 1A, FIG. 2A is a cross-sectional view of the RRAM device 200 including a substrate 202 with a conductive feature 204, which is provided, at one of the various stages of fabrication, according to some embodiments. Although the RRAM device 200 in the illustrated embodiment of FIG. 2A includes only one conductive feature 204, it is understood that the illustrated embodiment of FIG. 2A and the following figures are merely provided for illustration purposes. Thus, the RRAM device 200 may include any desired number of conductive features while remaining within the scope of the present disclosure.

In some embodiments, the substrate 202 is a dielectric material substrate formed over various device features (e.g., a source, drain, or gate electrode of a transistor). Such a dielectric material substrate 202 may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In such an embodiment where the substrate 202 includes a dielectric material, the conductive feature 204 may be a horizontal or vertical conductive structure formed within the substrate 202. For example, the conductive feature 204 may be an interconnection structure (i.e., a horizontal conductive structure), or a via structure (i.e., a vertical conductive structure). Accordingly, the conductive feature 204 may be electrically coupled to a device feature of a transistor, for example, a source, drain, or gate feature of the transistor that is disposed below the tier where the substrate 202 is provided. In some embodiments, the conductive feature 204 may be formed of a metal material (e.g., copper (Cu), aluminum (Al), tungsten (W), etc.).

As mentioned above, the conductive feature 204 may serve as a common bottom electrode of a plurality of RRAM resistors of the RRAM device 200. In some embodiments, when viewed from the top, the conductive feature may be formed as a stripe to accommodate the plurality of RRAM resistors. Further, a plurality of such stripes, each including a plurality of RRAM resistors, may be each disposed along a row, or a column, to form an array of RRAM resistors, which will be discussed in further detail below with respect to FIG. 4.

Figure 2B:
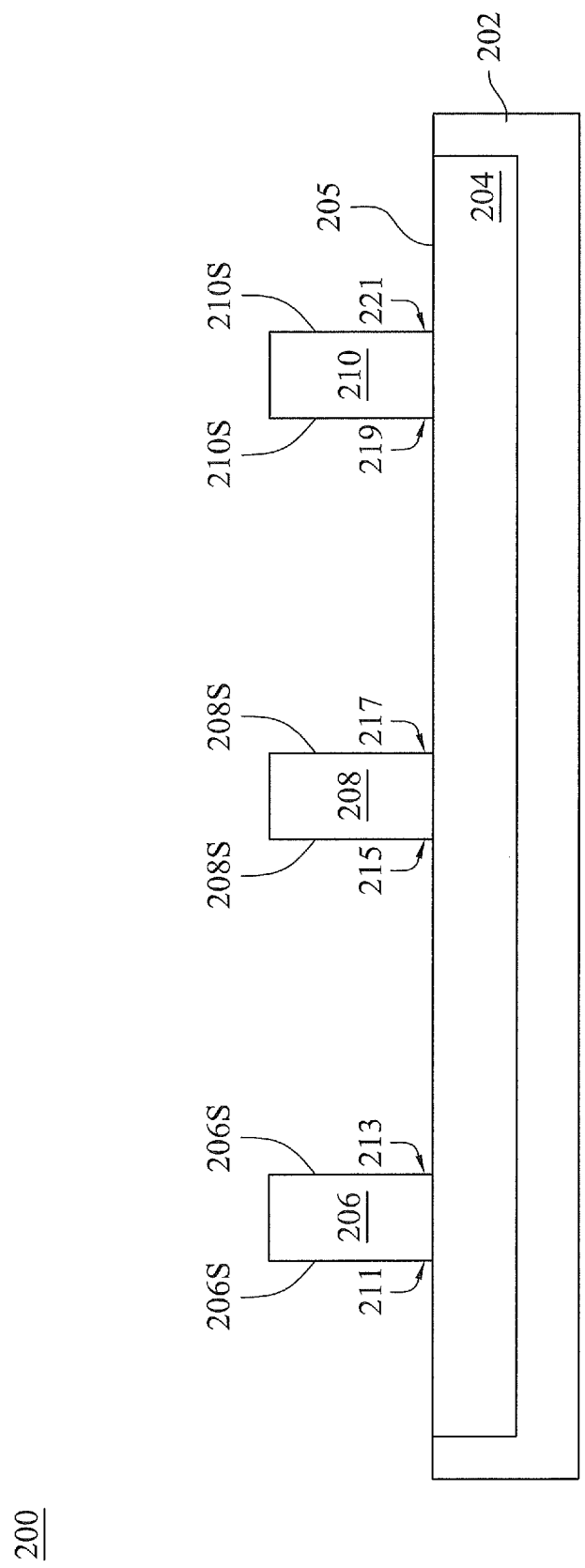

Corresponding to operation 104 of FIG. 1A, FIG. 2B is a cross-sectional view of the RRAM device 200 including a plurality of dielectric fin structures 206, 208 and 210, which are formed, at one of the various stages of fabrication, according to some embodiments. As shown, in some embodiments, the plurality of dielectric fin structures 206 to 210 are formed on and within an area confined by the conductive feature 204. And each of the dielectric fin structures 206 to 210 protrudes beyond a major surface 205 of the conductive feature 204 and extends along a vertical direction, perpendicular to the major surface 205 of the conductive feature 204.

As such, in some embodiments, a plurality of (L-shaped) corners may be each formed at an intersection of a sidewall of one of the plurality of dielectric fin structures 206 to 210 and the major surface 205 of the conductive feature 204. For example, a corner 211 is formed at an intersection of one sidewall 206S of the dielectric fin structures 206 and the major surface 205, and a corner 213 is formed at an intersection of the other sidewall 206S of the dielectric fin structures 206 and the major surface 205; a corner 215 is formed at an intersection of one sidewall 208S of the dielectric fin structures 208 and the major surface 205, and a corner 217 is formed at an intersection of the other sidewall 208S of the dielectric fin structures 208 and the major surface 205; and a corner 219 is formed at an intersection of one sidewall 210S of the dielectric fin structures 210 and the major surface 205, and a corner 221 is formed at an intersection of the other sidewall 210S of the dielectric fin structures 210 and the major surface 205.

In some embodiments, each of the dielectric fin structures 206-210 may have a cross-section in any of a variety of shapes, e.g., a polygon. Alternatively stated, when viewed from the top, each of the dielectric fin structures 206-210 presents one of the above-mentioned shapes. However, in some embodiments, the respective sidewalls of each dielectric fin structure are not directly coupled to each other. Accordingly, the corners 211/213 around the same dielectric fin structure 206 are not directly coupled to each other; the corners 215/217 around the same dielectric fin structure 208 are not directly coupled to each other; and the corners 219/221 around the same dielectric fin structure 210 are not directly coupled to each other. In some embodiments, each of the dielectric fin structures 206-210 may have an aspect ratio (width/height) of about 0.01 to about 0.5. In some embodiments, a width of each of the dielectric fin structures 206-210 may be about 70 nm; and a height of each of the dielectric fin structures 206-210 may be about 140 nm to about 7000 nm. In some embodiments, a spacing between two adjacent dielectric fin structures among 206-210 may be about twice the width of each of the dielectric fin structures 206-210, e.g. about 140 nm.

In some embodiments, each of the dielectric fin structures 206-210 may be formed of an oxide material (e.g., silicon oxide). In some embodiments, the dielectric fin structures 206-210 are formed by performing at least some of the following processes: using chemical vapor deposition (CVD), high-density plasma (HDP) CVD, physical vapor deposition (PVD), spin-on coating, and/or other suitable techniques to deposit the oxide material over the substrate 202 and the conductive feature 204; and performing one or more patterning processes (e.g., a lithography process, a dry/wet etching process, a cleaning process, a soft/hard baking process, etc.) to, respectively or simultaneously, form the dielectric fin structures 206-210.

Figure 2C:
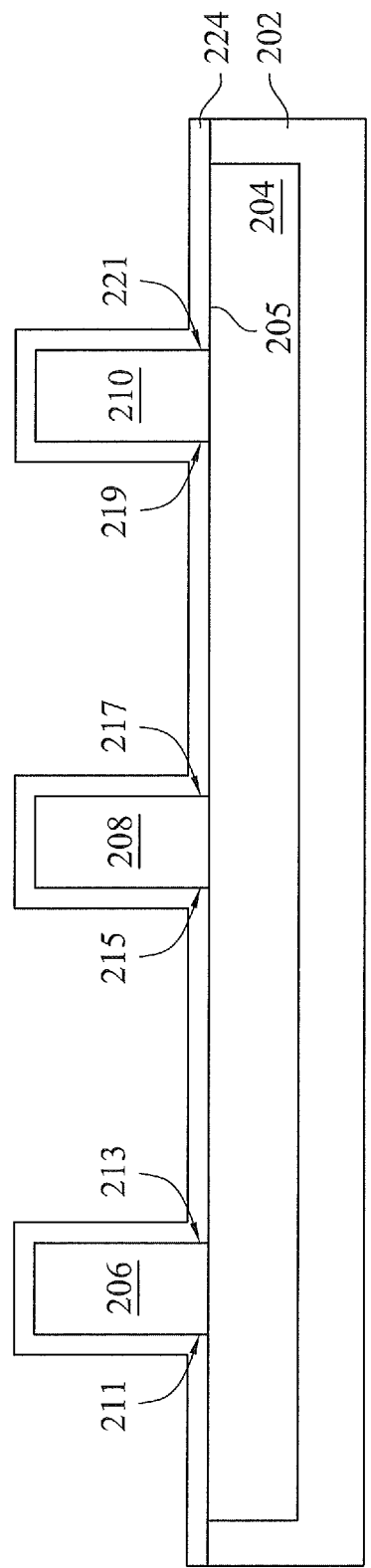

Corresponding to operation 106 of FIG. 1A, FIG. 2C is a cross-sectional view of the RRAM device 200 including a first capping layer 224, which is formed, at one of the various stages of fabrication, according to some embodiments. As shown, the first capping layer 224 is formed to overlay the major surface 205 of the conductive feature 204 and each of the dielectric fin structures 206-210. In some embodiments, the first capping layer 224 is substantially conformal and thin (e.g., about 20~50 nm in thickness) so that the first capping layer 224 may follow the L shape of each of the corners 211 to 221.

In some embodiments, the first capping layer 224 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the first capping layer 224 is shown as a single layer in the illustrated embodiment of FIG. 2C (and the following figures), it is noted that the first capping layer 224 may include plural layers formed as a stack, wherein each of the plural layers is formed of one of the above-described materials, e.g., TaN, TiN, etc. In some embodiments, the first capping layer 224 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202, the conductive feature 204, and the plurality of dielectric fin structures 206 to 210.

Figure 2D:
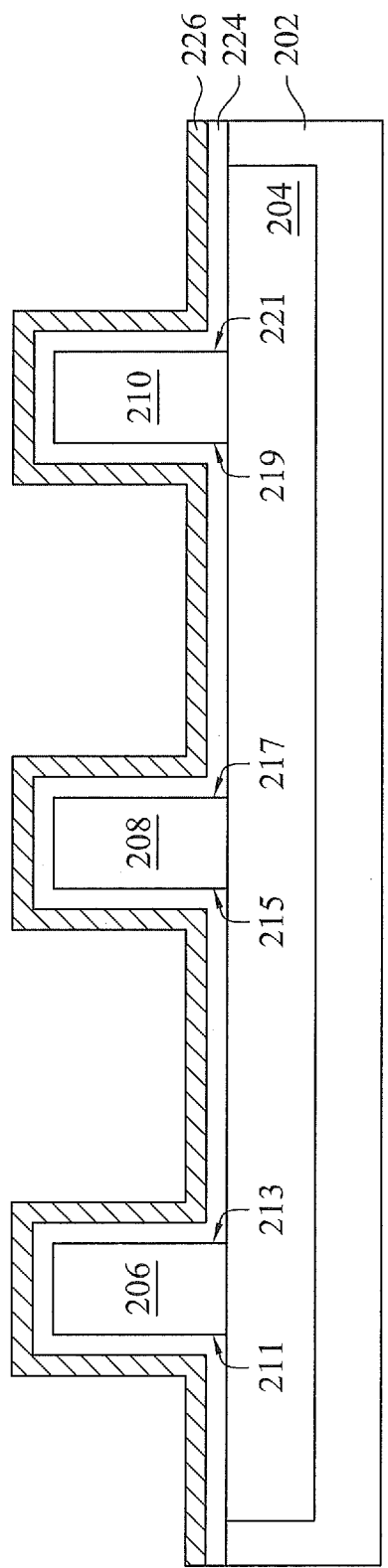

Corresponding to operation 108 of FIG. 1A, FIG. 2D is a cross-sectional view of the RRAM device 200 including a variable resistive material layer 226, which is formed, at one of the various stages of fabrication, according to some embodiments. As shown, the variable resistive material 226 is formed to overlay the first capping layer 224. In some embodiments, the variable resistive material layer 226 is substantially conformal and thin (e.g., about 2~10 nm in thickness) so that the first variable resistive material layer 226 may still follow the L shape of each of the corners 211 to 221.

In some embodiments, the variable resistive material layer 226 is a layer having a resistance conversion characteristic (e.g. variable resistance). In other words, the variable resistive material layer 226 includes material characterized to show reversible resistance variance in accordance with a polarity and/or an amplitude of an applied electrical pulse.

The variable resistive material layer 226 includes a dielectric layer. The variable resistive material layer 226 may be changed into a conductor or an insulator based on polarity and/or magnitude of electrical signal.

In one embodiment, the variable resistive layer 226 may include a transition metal oxide. The transition metal oxide maybe denoted as $M_xO_y$, where M is a transition metal, O is oxygen, x is the transition metal composition, and y is the oxygen composition. In an embodiment, the variable resistive material layer 226 includes $ZrO_2$. Examples of other materials suitable for the variable resistive material layer 226 include: NiO, $TiO_2$, HfO, ZrO, ZnO, $WO_3$, CoO, $Nb_2O_5$, $Fe_2O_3$, CuO, $CrO_2$, $SrZrO_3$ (Nb-doped), and/or other materials known in the art. In another embodiment, the variable resistive layer 226 may include a colossal magnetoresistance (CMR)-based material such as, for example, $Pr_{0.7}Ca_{0.3}$, $MnO_3$, etc.

In yet another embodiment, the variable resistive layer 226 may include a polymer material such as, for example, polyvinylidene fluoride and poly[(vinylidenefluoride-co-tri-fluoroethylene] (P(VDF/TrFE)). In yet another embodiment, the variable resistive layer 226 may include a conductive-bridging random access memory (CBRAM) material such as, for example, Ag in GeSe. According to some embodiments, the variable resistive material layer 226 may include multiple layers having characteristics of a resistance conversion material. A set voltage and/or a reset voltage of the variable resistive material layer 226 may be determined by the variable resistive material layer 226's compositions (including the values of "x" and "y" in "$M_xO_y$," as discussed above), thickness, and/or other factors known in the art.

In some embodiments, the variable resistive material layer 226 may be formed by an atomic layer deposition (ALD) technique with a precursor containing a metal and oxygen. In some embodiments, other chemical vapor deposition (CVD) techniques may be used. In some embodiments, the variable resistive material layer 226 may be formed by a physical vapor deposition (PVD) technique, such as a sputtering process with a metallic target and with a gas supply of oxygen and optionally nitrogen to the PVD chamber. In some embodiments, the variable resistive material layer 226 may be formed by an electron-beam deposition technique.

Figure 2E:
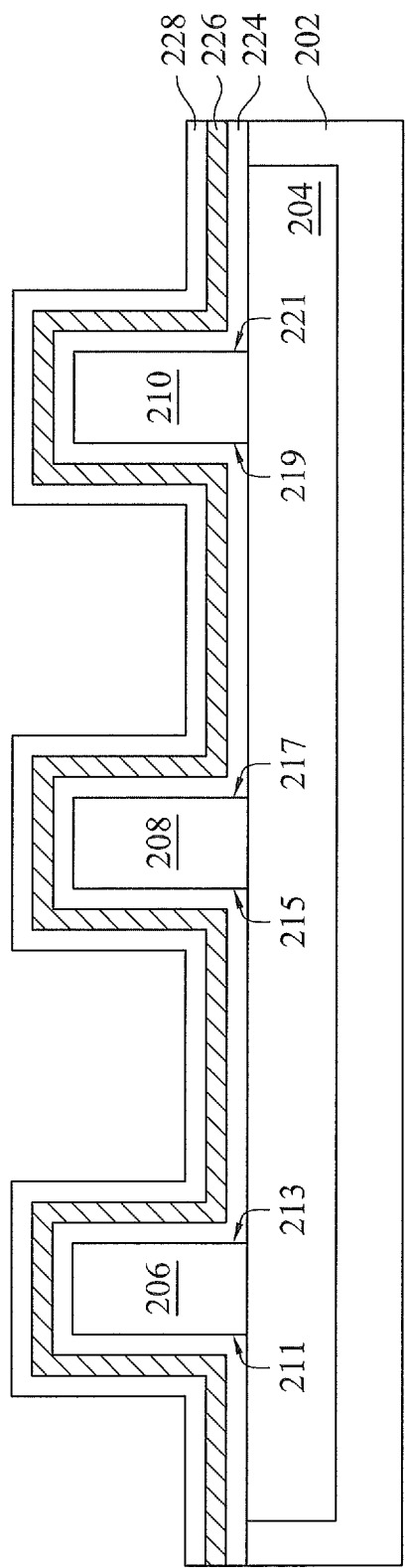

Corresponding to operation 110 of FIG. 1A, FIG. 2E is a cross-sectional view of the RRAM device 200 including a second capping layer 228, which is formed, at one of the various stages of fabrication, according to some embodiments. As shown, the second capping layer 228 is formed to overlay the variable resistive material layer 226. In some embodiments, the second capping layer 228 is substantially conformal and thin (e.g., about 20~50 nm in thickness) so that the second capping layer 228 may still follow the L shape of each of the corners 211 to 221.

In some embodiments, the second capping layer 228 may be formed of a substantially same material of the first capping layer 224. Thus, the second capping layer 228 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second capping layer 228 is shown as a single layer in the illustrated embodiment of FIG. 2E (and the following figures), it is noted that the second capping layer 228 may include plural layers formed as a stack, wherein each of the plural layers is formed of one of the above-described materials, e.g., TaN, TiN, etc. In some embodiments, the second capping layer 228 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the variable resistive material layer 226.

Figure 2F:
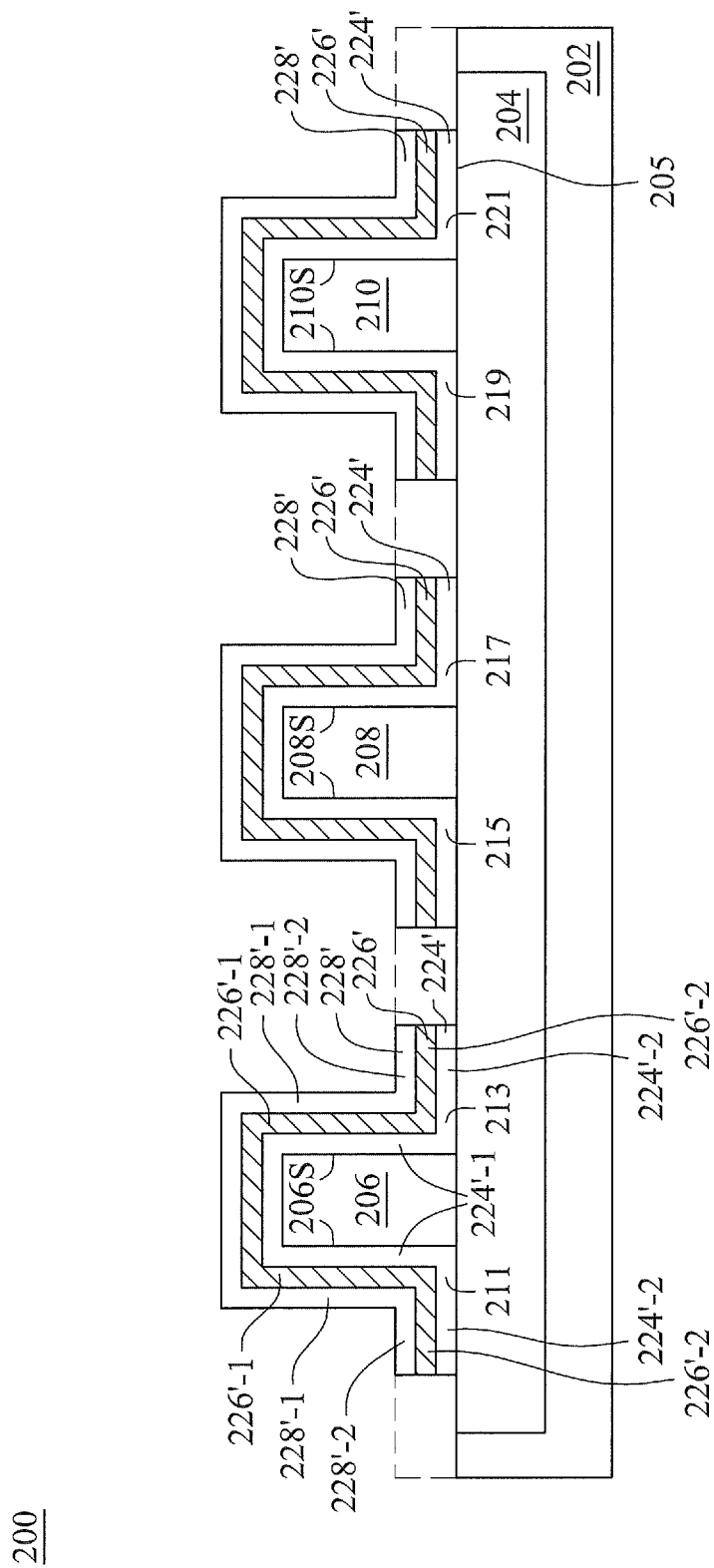

Corresponding to operation 112 of FIG. 1A, FIG. 2F is a cross-sectional view of the RRAM device 200 in which the first capping layer 224, the variable resistive material layer 226, and the second capping layer 228 are patterned, at one of the various stages of fabrication, according to some embodiments. According to some embodiments, the first capping layer 224, the variable resistive material layer 226, and the second capping layer 228 are patterned to remove part of respective horizontal portions (shown in dotted line) that are relatively farther from respective dielectric fin structures 206 to 210. As such, each of the dielectric fin structures 206 to 210, overlaid by respective "patterned" first capping layer 224', variable resistive material layer 226', and second capping layer 228', are laterally spaced apart from one another by a distance that may be filled with a portion of re-exposed major surface 205. The "patterned" first capping layer 224', variable resistive material layer 226', and second capping layer 228', are laterally spaced apart from one another. And, in some embodiments, the patterned first capping layer 224', variable resistive material layer 226', and second capping layer 228' may still follow the L shape of each of the corners 211 to 221.

More specifically, in some embodiments, the patterned first capping layer 224', variable resistive material layer 226', and second capping layer 228' may each include two vertical portions, extending along the sidewalls (e.g., 206S, 208S, 210S, etc.) of the overlaid dielectric fin structure (e.g., 206, 208, 210, etc.), and two horizontal portions, respectively coupled to the two vertical portions and directly contacting the conductive feature 204. For purposes of clarity, taking the patterned first capping layer 224', variable resistive material layer 226', and second capping layer 228' overlaying the dielectric fin structure 206 as a representative example, the patterned first capping layer 224' includes two vertical portions 224'-1 extending along the sidewalls 206S, respectively, and two horizontal portions 224'-2 respectively coupled to the vertical portions 224'-1 and directly contacting the conductive feature 204; the patterned variable resistive material layer 226' includes two vertical portions 226'-1 extending along the sidewalls 206S, respectively, and two horizontal portions 226'-2 respectively coupled to the vertical portions 226'-1 and directly contacting the conductive feature 204; and the patterned second capping layer 228' includes two vertical portions 228'-1 extending along the sidewalls 206S, respectively, and two horizontal portions 228'-2 respectively coupled to the vertical portions 228'-1 and directly contacting the conductive feature 204.

Figure 2G:
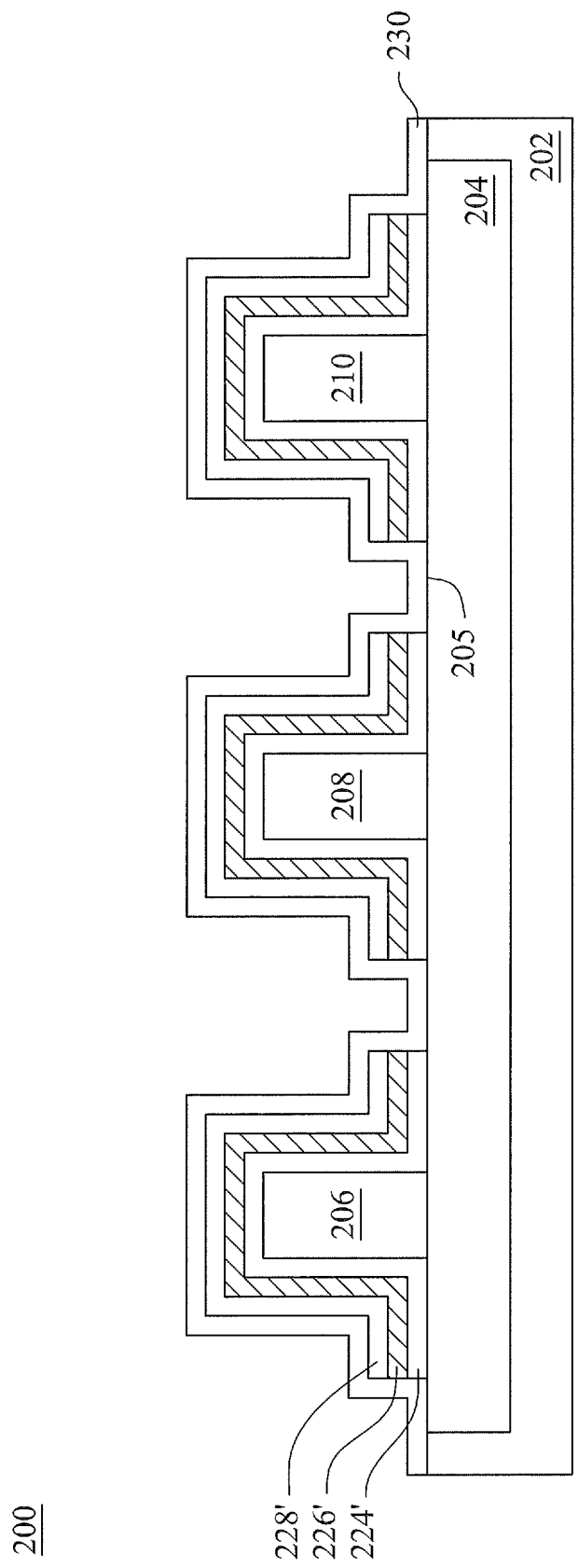

In some embodiments, the patterning process performed on the first capping layer 224, the variable resistive material layer 226, and the second capping layer 228 may include: a deposition process to form a patternable layer (e.g., a photoresist layer) over the substrate 202, a lithography process to define a profile of the patternable layer, a dry/wet etching process to etch respective portions of the first capping layer 224, the variable resistive material layer 226, and the second capping layer 228 that are not covered by the defined profile of the patternable layer, a cleaning process, and a soft/hard baking process Corresponding to operation 114 of FIG. 1A, FIG. 2G is a cross-sectional view of the RRAM device 200 including an isolation layer 230, which is formed, at one of the various stages of fabrication, according to some embodiments. As shown, the isolation layer 230 is formed to overlay the patterned first capping layer 224', variable resistive material layer 224', second capping layer 228', the re-exposed major surface 205, and the substrate 202.

In some embodiments, the isolation layer 230 may be silicon carbide, silicon oxynitride, silicon nitride, carbon doped silicon nitride, or carbon doped silicon oxide. The isolation layer 230 is selected to have a different etch selectivity than a dielectric layer 232 (shown in FIG. 2H), which will be discussed below. The isolation layer 230 is deposited over the patterned first capping layer 224', variable resistive material layer 224', second capping layer 228', the re-exposed major surface 205, and the substrate 202 using a chemical vapor deposition (CVD) technique such as a plasma enhanced (PE) CVD, a high-density plasma (HDP) CVD, an inductively-coupled-plasma (ICP) CVD, or a thermal CVD technique.

Figure 2H:
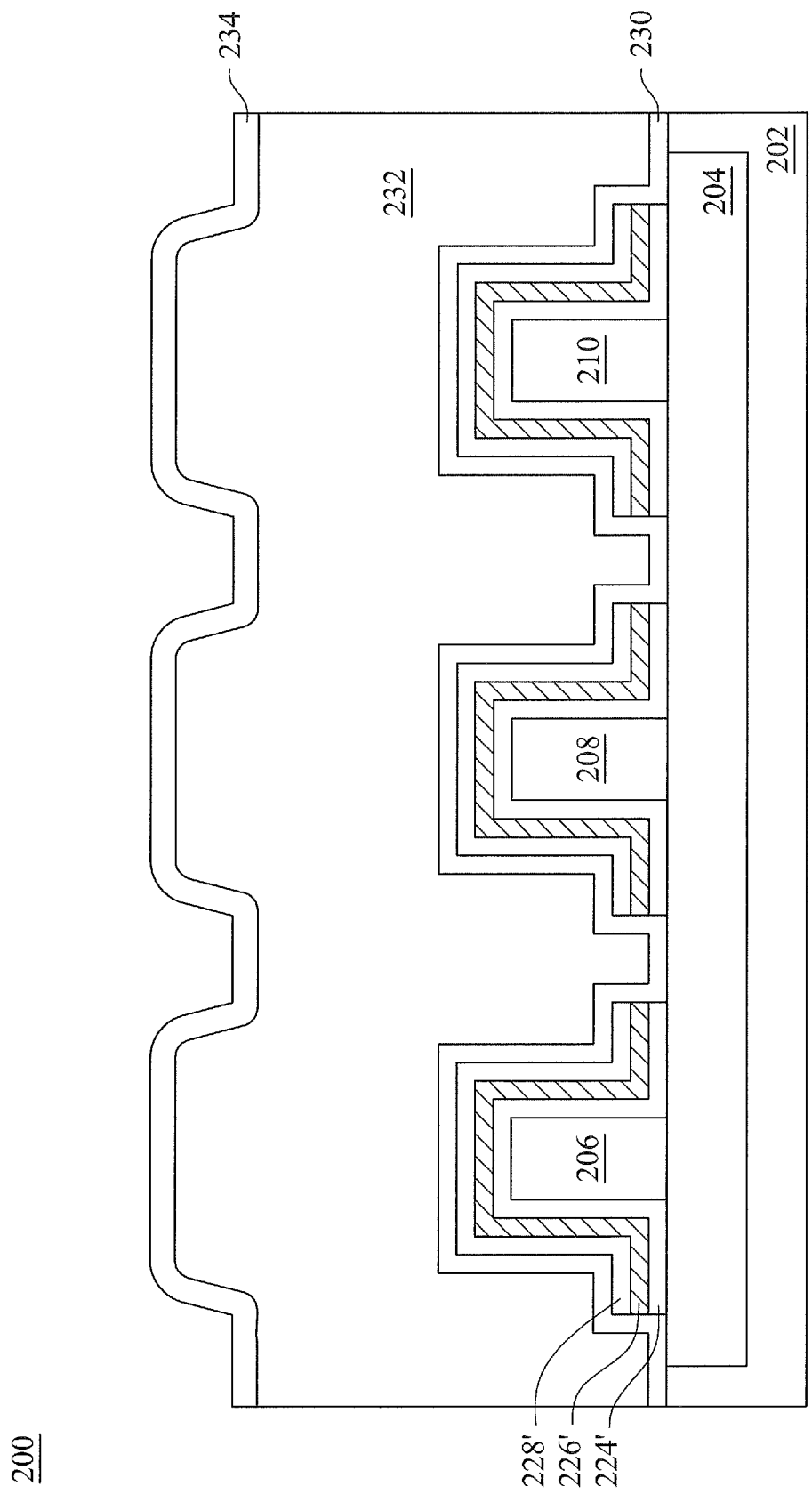

Corresponding to operation 116 of FIG. 1B, FIG. 2H is a cross-sectional view of the RRAM device 200 including a dielectric layer 232, which is formed, at one of the various stages of fabrication, according to some embodiments. As shown, the dielectric layer 232 is formed to overlay the isolation layer 230. In some embodiments, the dielectric layer 232 has a thickness (e.g., about 100 nm~700 nm) that is substantially higher than a height (e.g., less than about 100 nm) of each of the dielectric fin structures 206 to 210 overlaid by respective patterned first capping layer 224', variable resistive layer 226', and second capping layer 228', and the isolation layer 230. In some embodiments, an anti-reflective coating (ARC) layer 234 may be optionally formed over the dielectric layer 232.

In some embodiments, the dielectric layer 232 may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the dielectric layer 232 is deposited over the isolation layer 230 using a chemical vapor deposition (CVD) technique such as a plasma enhanced (PE) CVD, a high-density plasma (HDP) CVD, an inductively-coupled-plasma (ICP) CVD, or a thermal CVD technique.

Figure 2I:
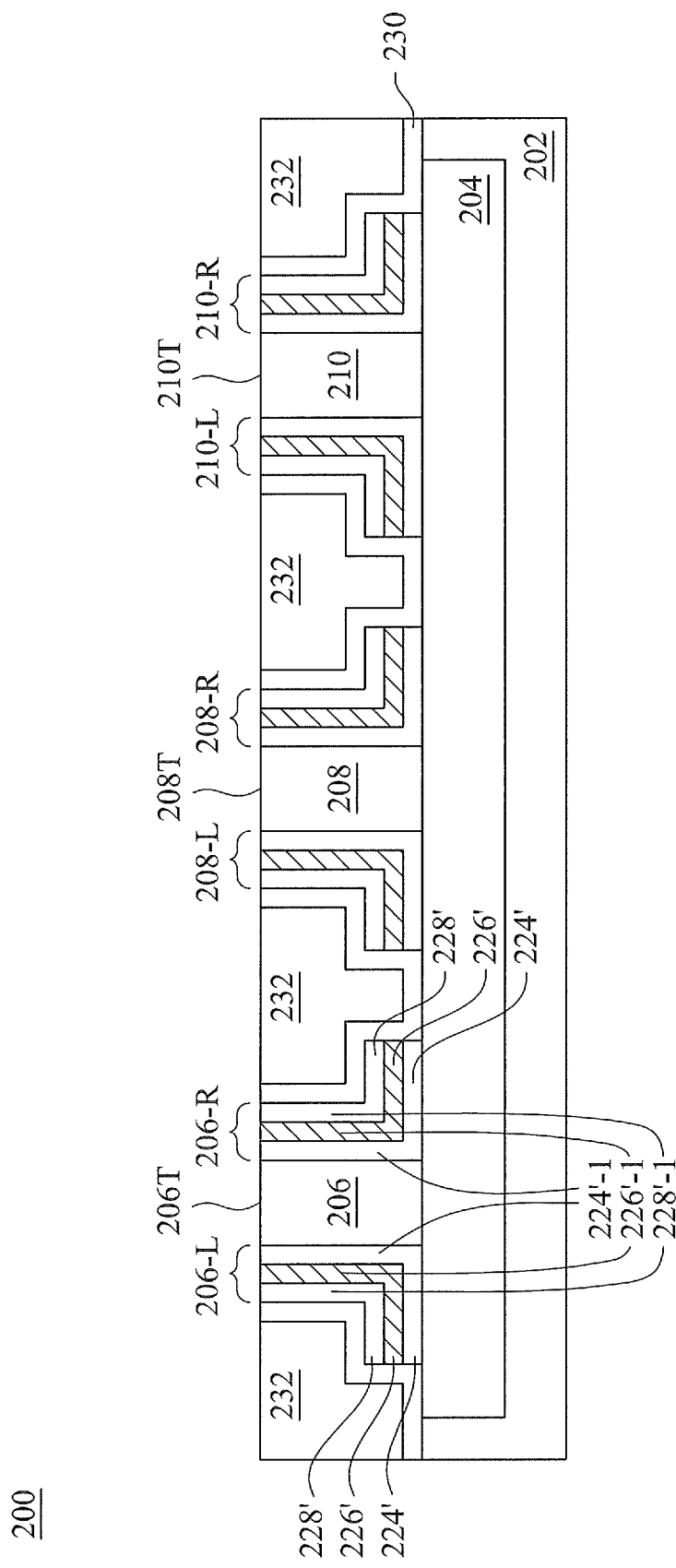

Corresponding to operation 118 of FIG. 1B, FIG. 2I is a cross-sectional view of the RRAM device 200 in which top surfaces 206T, 208T, and 210T of the plurality of dielectric fin structures 206, 208, and 210 are respectively re-exposed at one of the various stages of fabrication, according to some embodiments. As shown, when the top surfaces 206T to 210T are re-exposed, respective top surfaces of the vertical portions 224'-1, 226'-1, and 228'-1 of the patterned second capping layer 228', variable resistive material layer 226', and first capping layer 224' are also exposed. And, in some embodiments, the patterned second capping layer 228', variable resistive material layer 226', and first capping layer 224' overlaying a respective dielectric fin structure 206, 208 or 210 may be separated at two sides of the respective dielectric fin structure.

For example, the patterned second capping layer 228', variable resistive material layer 226', and first capping layer 224' overlaying the dielectric fin structure 206 are separated at left-hand and right-hand sides of the dielectric fin structure 206; the patterned second capping layer 228', variable resistive material layer 226', and first capping layer 224' overlaying the dielectric fin structure 208 are separated at left-hand and right-hand sides of the dielectric fin structure 208; and the patterned second capping layer 228', variable resistive material layer 226', and first capping layer 224' overlaying the dielectric fin structure 210 are separated at left-hand and right-hand sides of the dielectric fin structure 210.

For purposes of clarity, in the following discussions, the patterned second capping layer 228', variable resistive material layer 226', and first capping layer 224' that are separated at the left-hand side of the dielectric fin structure 206 are collectively referred to as "RRAM layer 206-L"; the patterned second capping layer 228', variable resistive material layer 226', and first capping layer 224' that are separated at the right-hand side of the dielectric fin structure 206 are collectively referred to as "RRAM layer 206-R"; the patterned second capping layer 228', variable resistive material layer 226', and first capping layer 224' that are separated at the left-hand side of the dielectric fin structure 208 are collectively referred to as "RRAM layer 208-L"; the patterned second capping layer 228', variable resistive material layer 226', and first capping layer 224' that are separated at the right-hand side of the dielectric fin structure 208 are collectively referred to as "RRAM layer 208-R"; the patterned second capping layer 228', variable resistive material layer 226', and first capping layer 224' that are separated at the left-hand side of the dielectric fin structure 210 are collectively referred to as "RRAM layer 210-L"; and the patterned second capping layer 228', variable resistive material layer 226', and first capping layer 224' that are separated at the right-hand side of the dielectric fin structure 210 are collectively referred to as "RRAM layer 210-R".

In some embodiments, the exposure process of the top surfaces 206T to 210T may include: a polishing process (e.g., a chemical-mechanical polishing (CMP) process) performed on respective portions of the dielectric layer 232, the isolation layer 230, the patterned second capping layer 228', the patterned variable resistive material layer 226', and the patterned first capping layer 224' until the top surfaces 206T to 210T are respectively exposed; and a cleaning process.

Figure 2J:
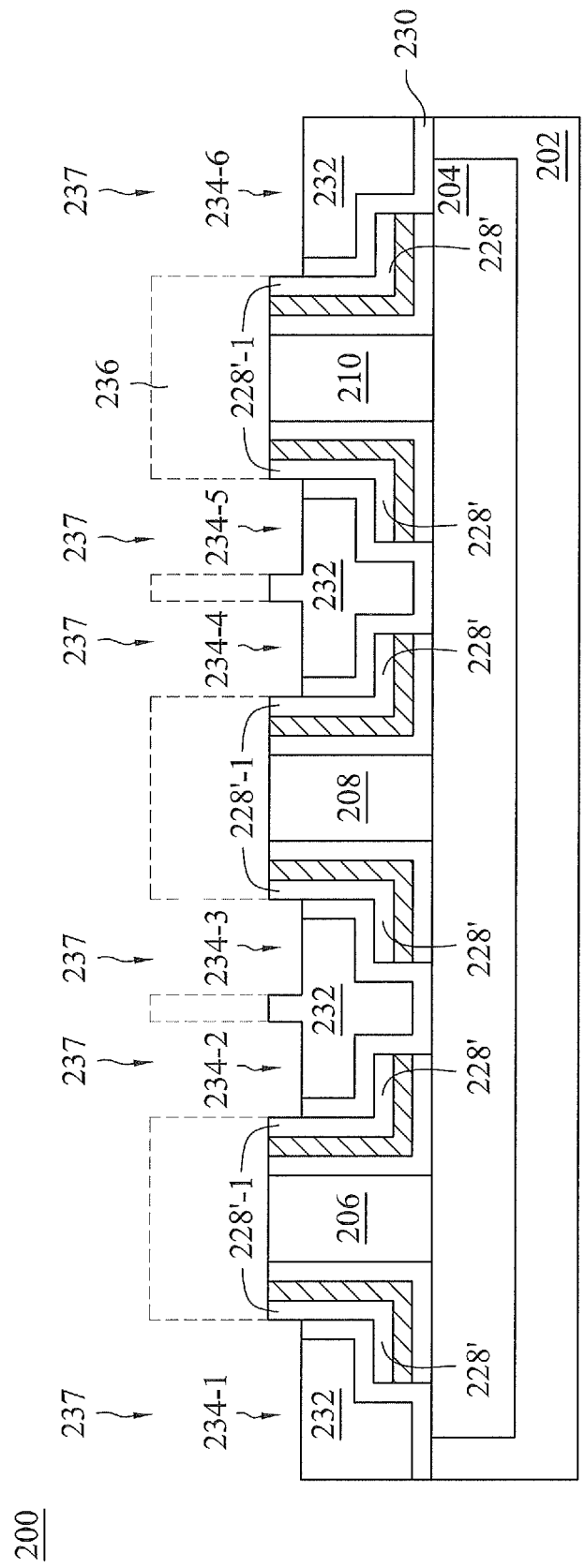

Corresponding to operation 120 of FIG. 1B, FIG. 2J is a cross-sectional view of the RRAM device 200 including a plurality of recessed regions 234-1, 234-2, 234-3, 234-4, 234-5, and 234-6, which are formed, at one of the various stages of fabrication, according to some embodiments. As shown, the plurality of recessed regions 234-1 to 234-6 are formed within the dielectric layer 232 and the isolation layer 230. More specifically, in some embodiments, forming the recessed region 234-1 to 234-6 may re-expose an upper sidewall of each of the vertical portions 228'-1 of the patterned second capping layer 228'.

In some embodiments, the recessed regions 234-1 to 234-6 are formed by performing at least some of the following processes: forming an optional anti-reflective coating (ARC) layer over the substrate; forming a patternable layer 236 (e.g., a photoresist layer) with plural openings 237 as shown in FIG. 2J; while using the patternable layer 236 as a mask, performing one or more dry etching processes to remove plural upper portions of the isolation layer 232; and removing the patternable layer 236.

Figure 2K:
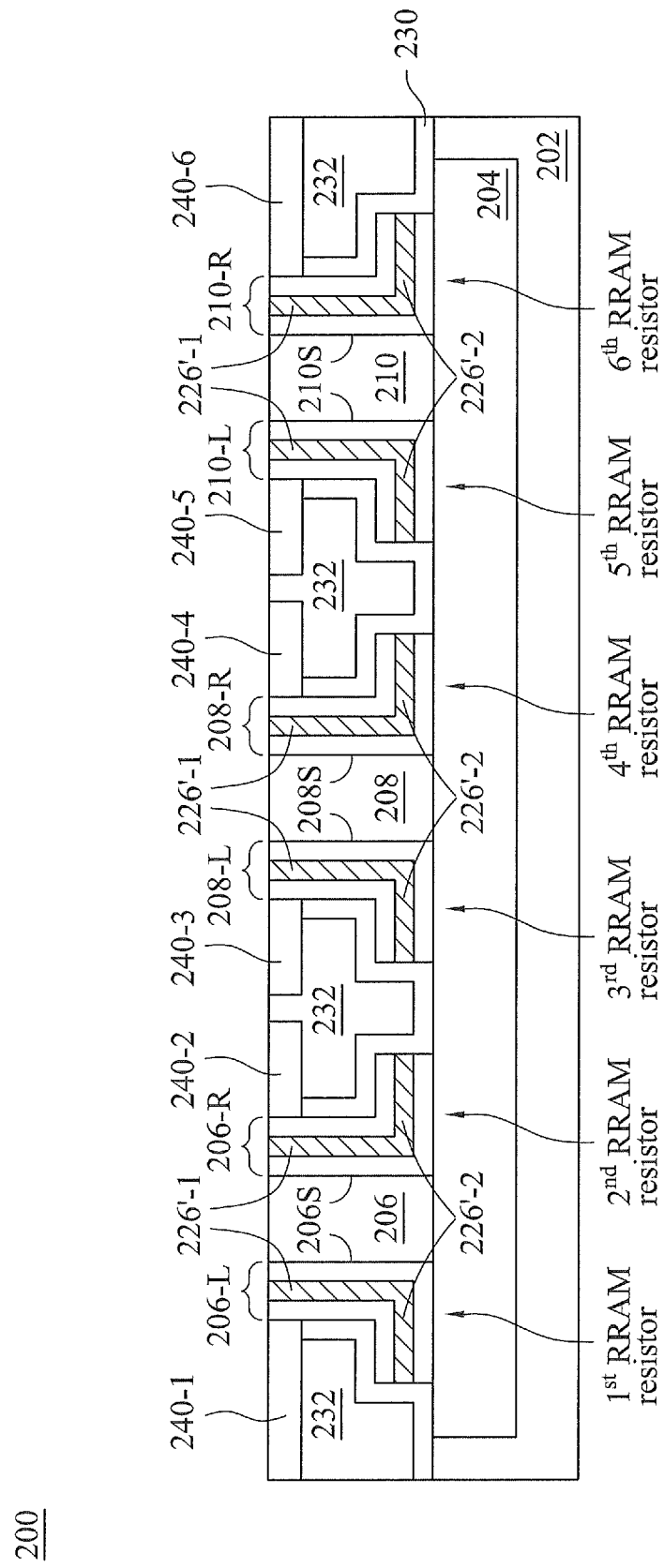

Corresponding to operation 122 of FIG. 1B, FIG. 2K is a cross-sectional view of the RRAM device 200 including a plurality of upper electrodes 240-1, 240-2, 240-3, 240-4, 240-5, and 240-6, which are formed, at one of the various stages of fabrication, according to some embodiments. In some embodiments, the upper electrodes 240-1 to 240-6 may be formed by refilling the respective recessed regions 234-1 to 234-6 (FIG. 2J) by a metal material (e.g., copper (Cu)). In some embodiments, each of the upper electrodes 240-1 to 240-6 may be coupled to one of the "RRAM layers", e.g., 206-L, 206-R, 208-L, 208-R, 210-L, or 210-R. More specifically, each of the upper electrodes 240-1 to 240-6 may be coupled to a respective vertical portion 226'-1 of a patterned variable resistive material layer 226' contained in each RRAM layer. In one embodiment, the RRAM device 200 is substantially coplanar with the top surfaces of the upper electrodes 240-1 to 240-6.

For example, the upper electrode 240-1 is coupled to the vertical portion 226'-1 of the patterned variable resistive material layer 226' contained in the RRAM layer 206-L; the upper electrode 240-2 is coupled to the vertical portion 226'-1 of the patterned variable resistive material layer 226' contained in the RRAM layer 206-R; the upper electrode 240-3 is coupled to the vertical portion 226'-1 of the patterned variable resistive material layer 226' contained in the RRAM layer 208-L; the upper electrode 240-4 is coupled to the vertical portion 226'-1 of the patterned variable resistive material layer 226' contained in the RRAM layer 208-R; the upper electrode 240-5 is coupled to the vertical portion 226'-1 of the patterned variable resistive material layer 226' contained in the RRAM layer 210-L; and the upper electrode 240-6 is coupled to the vertical portion 226'-1 of the patterned variable resistive material layer 226' contained in the RRAM layer 210-R.

Further, in some embodiments, any two adjacent upper electrodes 240-1 to 240-6 are laterally spaced apart from each other (e.g., electrically isolated) by either one of dielectric fin structures 206 to 210, or the dielectric layer 232. For example, the upper electrodes 240-1 and 240-2 are laterally spaced apart from each other by the dielectric fin structures 206; the upper electrodes 240-2 and 240-3 are laterally spaced apart from each other by the dielectric layer 232; the upper electrodes 240-3 and 240-4 are laterally spaced apart from each other by the dielectric fin structures 208; the upper electrodes 240-4 and 240-5 are laterally spaced apart from each other by the dielectric layer 232; and the upper electrodes 240-5 and 240-6 are laterally spaced apart from each other by the dielectric fin structures 210.

As such, a plurality of RRAM resistors may be formed. In the illustrated embodiment of FIG. 2K, a $1^{st}$ RRAM resistor is formed by the RRAM layer 206-L, the upper electrode 240-1, and the conductive feature 204, which serves as the bottom electrode of the $1^{st}$ RRAM resistor (and other laterally spaced RRAM resistors), as described above. More specifically, the upper electrode 240-1 is coupled to the vertical portion 226'-1 of the patterned variable resistive material layer 226' contained in the RRAM layer 206-L, and the bottom electrode 204 is coupled to the horizontal portion 226'-2 of the patterned variable resistive material layer 226' contained in the RRAM layer 206-L. Similarly, a $2^{nd}$ RRAM resistor is formed by the RRAM layer 206-R, the upper electrode 240-2, and the conductive feature (bottom electrode) 204; a $3^{rd}$ RRAM resistor is formed by the RRAM layer 208-L, the upper electrode 240-3, and the conductive feature (bottom electrode) 204; a $4^{th}$ RRAM resistor is formed by the RRAM layer 208-R, the upper electrode 240-4, and the conductive feature (bottom electrode) 204; a $5^{th}$ RRAM resistor is formed by the RRAM layer 210-L, the upper electrode 240-5, and the conductive feature (bottom electrode) 204; a $6^{th}$ RRAM resistor is formed by the RRAM layer 210-R, the upper electrode 240-6, and the conductive feature (bottom electrode) 204.

It is noted that by using the method 100 to form the plurality of RRAM resistors, any two adjacent ones of the plurality of RRAM resistors are mirror-symmetric over one of the dielectric fin structures 206, 208, and 210. For example, the $1^{st}$ and $2^{nd}$ RRAM resistors are mirror-symmetric over the dielectric fin structure 206; the $3^{rd}$ and $4^{th}$ RRAM resistors are mirror-symmetric over the dielectric fin structure 208; and the $5^{th}$ and $6^{th}$ RRAM resistors are mirror-symmetric over the dielectric fin structure 210. Specifically, the respective first capping layers, variable resistive material layers, and second capping layers of the $1^{st}$ and $2^{nd}$ RRAM resistors are mirror-symmetric over the dielectric fin structure 206; the respective first capping layers, the variable resistive material layers, and the second capping layers of the $3^{rd}$ and $4^{th}$ RRAM resistors are mirror-symmetric over the dielectric fin structure 208; and the respective first capping layers, the variable resistive material layers, and the second capping layers of the $5^{th}$ and $6^{th}$ RRAM resistors are mirror-symmetric over the dielectric fin structure 210.

In some embodiments, at a circuit-design level, the common bottom electrode 204 may be coupled to a bit line (BL), and the upper electrodes 240-1 to 240-6 that belong to respective different RRAM resistors are each coupled to a respective transistor, which is also known as a selection transistor. As such, plural 1-transistor-1-resistor (1T1R) RRAM bit cells may be formed.

Figure 3:
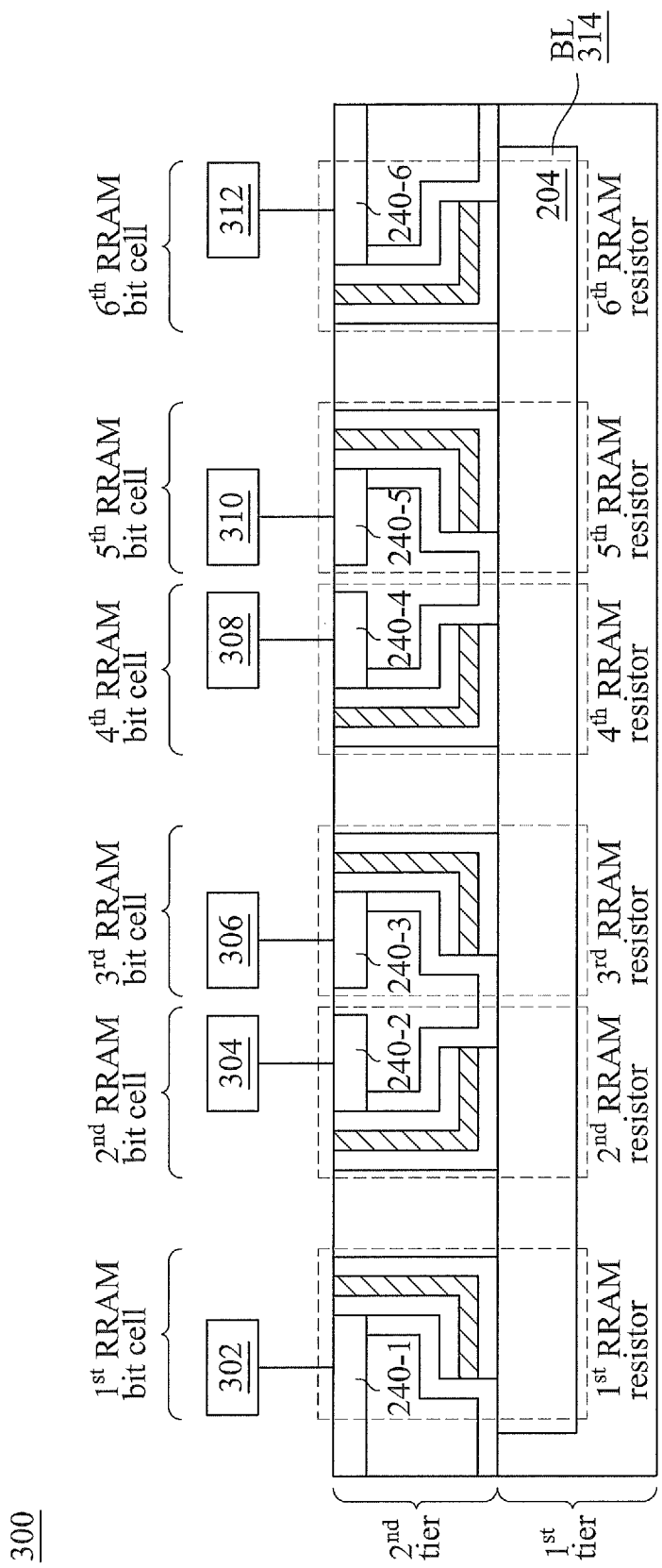
FIG. 3 illustrates an example in which the semiconductor device of FIGS. 2A-2K is coupled to one or more transistors, in accordance with some embodiments.

FIG. 3 illustrates an RRAM device 300 including plural such 1T1R RRAM bit cells. In particular, the RRAM device 300 of FIG. 3 is reproduced from the RRAM device 200 of FIG. 2K, but the RRAM device 300 further includes plural selection transistors 302, 304, 306, 308, 310, and 312. More specifically, in some embodiments, the $1^{st}$ RRAM resistor is coupled to a BL 314 through the common bottom electrode 204, and coupled to a drain or source feature of the selection transistor 302 through the upper electrode 240-1, which forms a $1^{st}$ 1T1R RRAM bit cell. Similarly, the $2^{nd}$ RRAM resistor is coupled to the BL 314 through the common bottom electrode 204, and coupled to a drain or source feature of the selection transistor 304 through the upper electrode 240-2, which forms a $2^{nd}$ 1T1R RRAM bit cell; the $3^{rd}$ RRAM resistor is coupled to the BL 314 through the common bottom electrode 204, and coupled to a drain or source feature of the selection transistor 306 through the upper electrode 240-3, which forms a $3^{rd}$ 1T1R RRAM bit cell; the $4^{th}$ RRAM resistor is coupled to the BL 314 through the common bottom electrode 204, and coupled to a drain or source feature of the selection transistor 308 through the upper electrode 240-4, which forms a $4^{th}$ 1T1R RRAM bit cell; the $5^{th}$ RRAM resistor is coupled to the BL 314 through the common bottom electrode 204, and coupled to a drain or source feature of the selection transistor 310 through the upper electrode 240-6, which forms a $5^{th}$ 1T1R RRAM bit cell; and the $6^{th}$ RRAM resistor is coupled to the BL 314 through the common bottom electrode 204, and coupled to a drain or source feature of the selection transistor 312 through the upper electrode 240-6, which forms a $6^{th}$ 1T1R RRAM bit cell.

Although, in FIG. 3, the selection transistors 302 to 312 are illustrated as being disposed above tiers where the common bottom electrode 204 is formed (hereinafter "$1^{st}$ tier") and the plural RRAM resistors are formed (hereinafter "$2^{nd}$ tier"), it is merely for illustration purposes. In some embodiments, such selection transistors 302 to 312 may be formed below the 1$^{st}$ and 2$^{nd}$ tiers.

As mentioned above, in existing RRAM devices and methods forming the same, a maximum number of RRAM bit cells that can be integrated within a given area is limited because the active area of the variable resistive material layer of each existing RRAM bit cell typically extends in parallel with respective top/bottom electrodes. In stark contrast, the variable resistive material layer of the RRAM bit cell of the disclosed RRAM device (e.g., 200/300) is formed to have vertical and horizontal portions, which allows a respective active area of the variable resistive material layer to extend along more than one direction. As such, a maximum number of RRAM bit cells that can be integrated into a "row" of the disclosed RRAM device (e.g., 200/300) can be substantially increased. Further, plural such rows can be repeatedly formed to integrate more RRAM bit cells into the disclosed RRAM device (e.g., 200/300). As such, a total number of RRAM bit cells that can be integrated into the disclosed RRAM device (e.g., 200/300) can be further increased.

Figure 4:
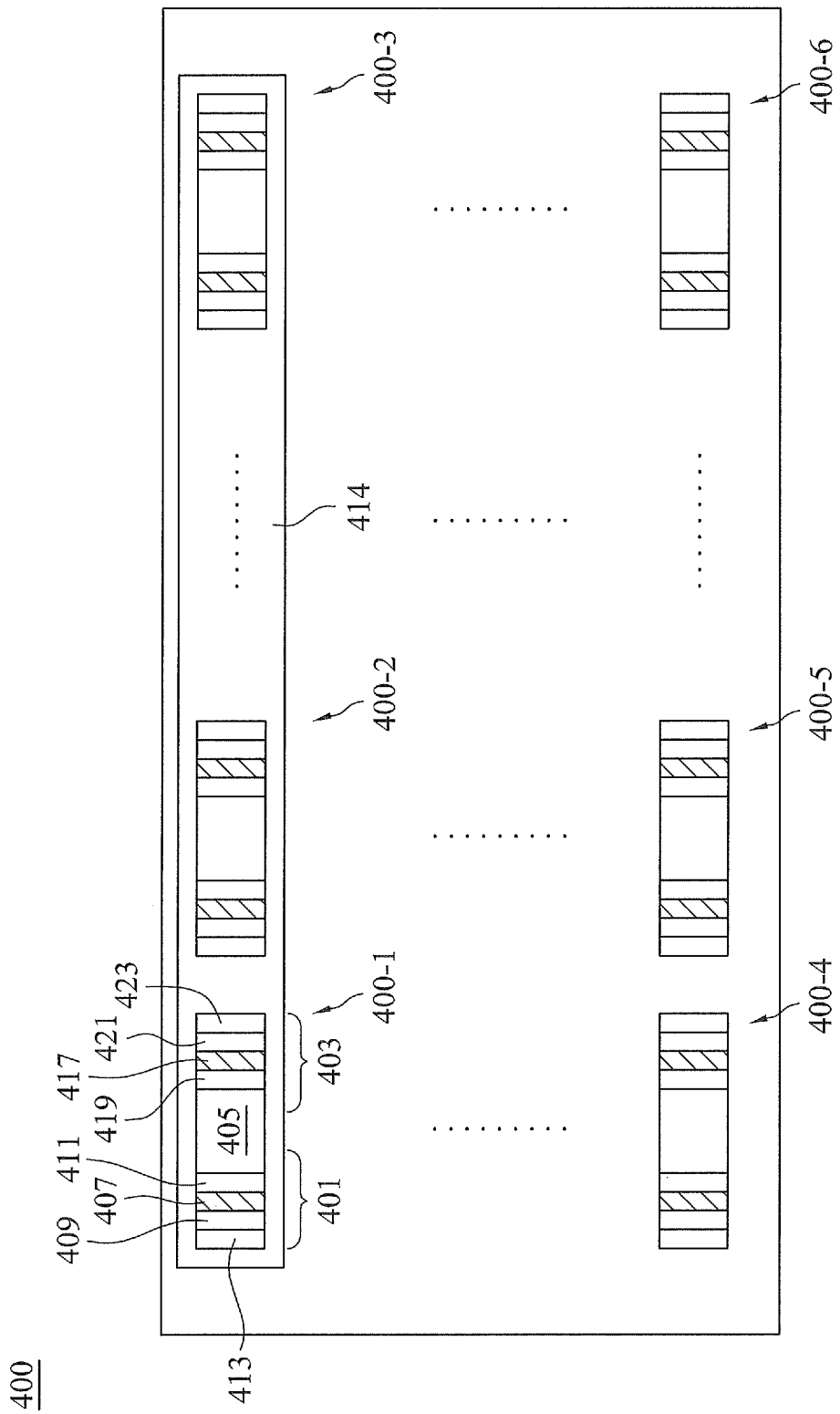
FIG. 4 illustrates a top view of a semiconductor device, made by the method of FIG. 1, in accordance with some embodiments.

FIG. 4 illustrates a top view of an RRAM device 400 including a plurality of the above-mentioned integrated RRAM bit cells, in accordance with some embodiments. It is noted that the top view of FIG. 4 is simplified for illustration purposes such that only top views of respective RRAM resistors of the plurality of RRAM bit cells are shown. In the illustrated embodiment of FIG. 4, the RRAM device 400 includes plural RRAM units 400-1, 400-2, 400-3, 400-4, 400-4, 400-5, and 400-6, each of which includes at least two RRAM resistors. As shown, the RRAM units 400-1 and up to 400-3 are arranged along a first row, and a plurality of such rows (e.g., a row formed by RRAM units 400-4 and up to 400-6) can be repeatedly disposed across the RRAM device 400.

Each RRAM unit includes at least two disclosed RRAM resistors. Taking the RRAM unit 400-1 as an example, the RRAM unit 400-1 includes RRAM resistors 401 and 403, each of which is substantially similar to the 1$^{st}$, 2$^{nd}$, 3$^{rd}$, 4$^{th}$, 5$^{th}$, and 6$^{th}$ RRAM resistors described with respect to FIGS. 2A-2K. In particular, the RRAM resistors 401 and 403 are laterally spaced apart by a dielectric fin structure 405 (substantially similar to the dielectric fin structures 206, 208, and 210). The RRAM resistor 401 is formed by a variable resistive material layer 407 (substantially similar to the patterned variable resistive material layers 226'), first and second capping layers 409 and 411 (substantially similar to the patterned first and second capping layers 224' and 228', respectively), an upper electrode 413 (substantially similar to the upper electrodes 240-1 to 240-6), and a common bottom electrode 414 (substantially similar to the common bottom electrode 204). Similarly, the RRAM resistor 403 is formed by a variable resistive material layer 417, first and second capping layers 419 and 421, an upper electrode 423, and the common bottom electrode 414.

Figure 5:
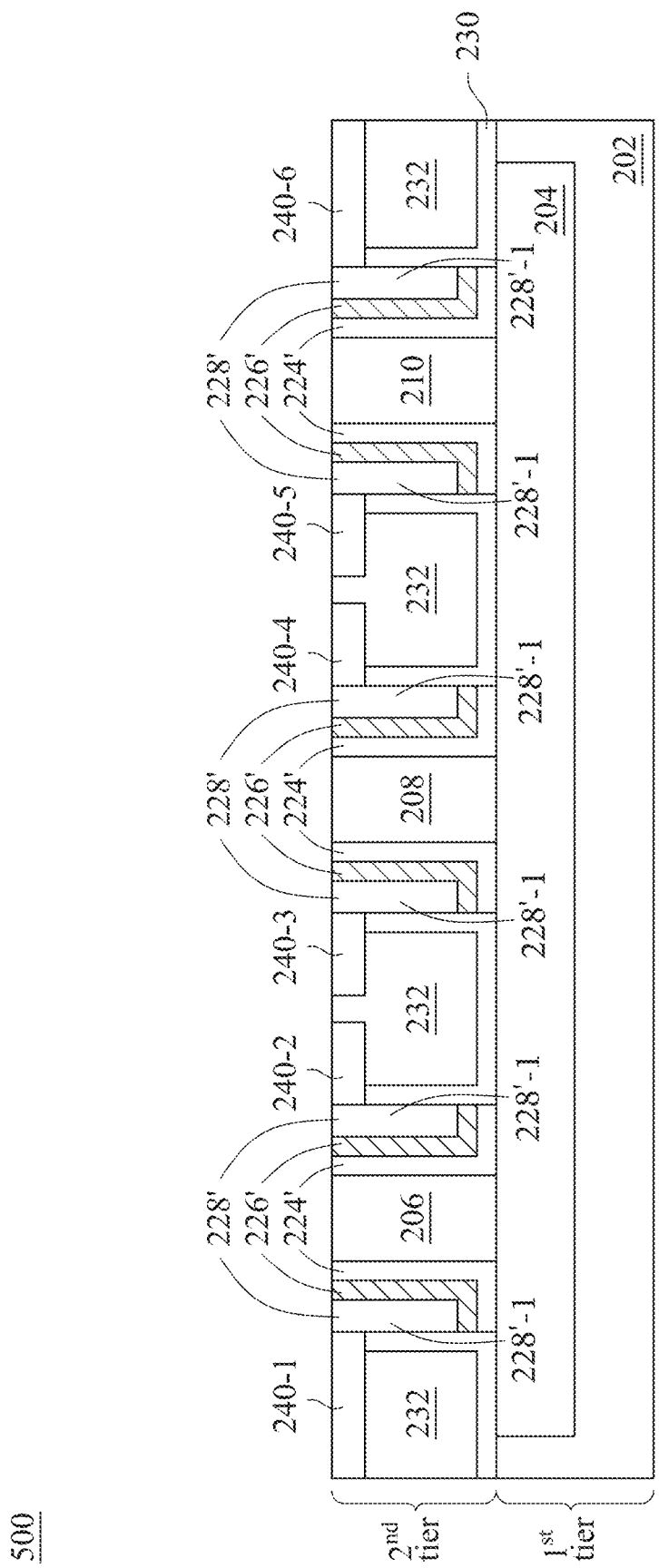
FIG. 5 illustrates an alternative structure of the semiconductor device of FIGS. 2A-2K, in accordance with some embodiments.

FIG. 5 illustrates an alternative structure of the RRAM device 200 as shown in FIG. 2K. For clarity, the alternative structure of the RRAM device 200 is herein referred to as a "RRAM device 500." As shown, the RRAM device 500 is substantially similar to the RRAM device 200 except that each of the patterned second capping layers 228' has only the respective vertical portion 228'-1.

In an embodiment, a memory cell includes: a resistive material layer comprising a first portion that extends along a first direction and a second portion that extends along a second direction, wherein the first and second directions are different from each other; a first electrode coupled to a bottom surface of the first portion of the resistive material layer; and a second electrode coupled to the second portion of the resistive material layer.

In another embodiment, a memory device includes: a first resistive material layer and a second resistive material layer that are laterally spaced from each other by a dielectric structure, wherein the first and second resistive material layers each comprises a horizontal portion and a vertical portion, and wherein the vertical portions of the first and second resistive material layers each extends along a respective sidewall of the dielectric structure, and the horizontal portions of the first and second resistive material layers extend toward opposite directions.

In yet another embodiment, a memory device includes: a plurality of dielectric structures laterally spaced from one another; and a plurality of pairs that each comprises first and second resistive material layers, wherein the first and second resistive material layers of each of the plurality of pairs are mirror-symmetric over one of the plurality of dielectric structures, and respective vertical portions of the first and second resistive material layers each extends along a sidewall of the one of the plurality of dielectric structures, and respective horizontal portions of the first and second resistive material layers each extends away from the one of the plurality of dielectric structures.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a substrate; a dielectric fin structure disposed above the substrate and extending upwardly from the substrate;
    a first resistive material structure disposed adjacent a first side of the dielectric fin structure, the first resistive material comprising a first vertical portion disposed along a first sidewall of the dielectric fin structure and a first horizontal portion that extends parallel to a top surface of the surface and away from the dielectric fin structure in a first direction; and
    a second resistive material structure disposed adjacent a second side of the dielectric fin structure, the second side being opposite the first side, the second resistive material comprising a second vertical portion disposed along a second sidewall of the dielectric fin structure and a second horizontal portion that extends parallel to the top surface of the surface and away from the dielectric fin structure in a second direction opposite the first direction.

2. The memory device of claim 1, further comprising:
    a bottom electrode formed in the substrate, wherein the first and second horizontal portions are formed above a top surface of the bottom electrode.

3. The memory device of claim 1, wherein the bottom electrode is formed below a plurality of dielectric fin structures spaced laterally from each other.

4. The memory device of claim 1, wherein the respective first and second vertical portions are coupled to respective different upper electrodes.

5. The memory device of claim 4, wherein the respective different upper electrodes are in parallel with the respective first and second horizontal portions of the first and second resistive material structures.

6. The memory device of claim 1, wherein the first and second resistive material structures each presents a respective variable resistance value.

7. The memory cell of claim 1, wherein the first and second resistive material structures each comprise at least one material selected from the group consisting of: $ZrO_2$, $NiO$, $TiO_2$, $HfO$, $ZrO$, $ZnO$, $WO_3$, $CoO$, $Nb_2O_5$, $Fe_2O_3$, $CuO$, $CrO_2$, or $SrZrO_3$.

8. A memory device, comprising:
a dielectric fin structure;
a first resistive material structure comprising a first vertical portion extending vertically and in parallel to a first sidewall of the dielectric fin structure, and first horizontal portion extending horizontally away from the dielectric fin structure in a first direction;
a second resistive material structure comprising a second vertical portion extending vertically and in parallel to a second sidewall of the dielectric fin structure, the second sidewall being opposite the first sidewall, and wherein the second resistive material structure further comprises a second horizontal portion extending horizontally away from the dielectric fin structure in a second direction opposite the first direction;
a first electrode coupled to respective bottom surfaces of the first and second horizontal portions;
a second electrode coupled to the first vertical portion of the first resistive material structure; and
a third electrode coupled to the second vertical portion of the second resistive material structure.

9. The memory device of claim 8, wherein each of the first and second resistive material structures comprises at least one material selected from the group consisting of: $ZrO_2$, $NiO$, $TiO_2$, $HfO$, $ZrO$, $ZnO$, $WO_3$, $CoO$, $Nb_2O_5$, $Fe_2O_3$, $CuO$, $CrO_2$, or $SrZrO_3$.

10. The memory device of claim 8, wherein the first, second, and third electrodes are in parallel to one another.

11. The memory device of claim 8, wherein the second and third electrodes are isolated from each other by the dielectric fin structure.

12. The memory device of claim 8, further comprising:
a first transistor, wherein the second electrode is coupled to a drain feature or a source feature of the first transistor; and
a second transistor, wherein the third electrode is coupled to a drain feature or a source feature of the second transistor.

13. The memory device of claim 8, wherein at least one of the first and second resistive material structures comprises a colossal magnetoresistance (CMR)-based material.

14. The memory device of claim 8, wherein:
the first resistive material structure, the first electrode, and the second electrode form a first resistive random access memory (RRAM) resistor; and
the first RRAM resistor further comprises:
a first capping layer comprising at least a portion that is coupled between the first electrode and the first horizontal portion of the first resistive material structure, and
a second capping layer comprising at least a portion that is coupled between the first vertical portion of the first resistive material structure and the second electrode.

15. The memory device of claim 14, wherein:
the second resistive material structure, the first electrode, and the third electrode form a second RRAM resistor; and
the second RRAM resistor further comprises:
a third capping layer comprising at least a portion that is coupled between the first electrode and the second horizontal portion of the second resistive material structure; and
a fourth capping layer comprising at least a portion that is coupled between the second vertical portion of the second resistive material structure and the third electrode.

16. The memory device of claim 8, wherein the first and second resistive material structures each presents a respective variable resistance value.

17. A method for forming a memory device, comprising:
providing a substrate;
forming a lower electrode in the substrate, wherein a top surface of the lower electrode is coplanar with a top surface of the substrate;
forming a dielectric fin structure above the top surface of the lower electrode;
forming a first capping layer over the substrate and the dielectric fin structure;
forming a variable resistive material layer over the first capping layer;
forming a second capping layer over the variable resistive material layer; and
polishing the variable resistive material layer to expose a top surface of the dielectric fin structure.

18. The method of claim 17, further comprising:
patterning the first capping layer, the variable resistive material layer and the second capping layer;
forming an isolation layer over the substrate; and
forming a dielectric layer over the isolation layer.

19. The method of claim 18, further comprising:
forming a recessed region in the dielectric layer; and
forming an upper electrode in the recessed region.

20. The method of claim 17, wherein the variable resistance material layer comprises: a first resistive material structure comprising a first vertical portion extending vertically and in parallel to a first sidewall of the dielectric fin structure, and a first horizontal portion extending horizontally away from the dielectric fin structure in a first direction;
a second resistive material structure comprising a second vertical portion extending vertically and in parallel to a second sidewall of the dielectric fin structure, the second sidewall being opposite the first sidewall, and wherein the second resistive material structure further comprises a second horizontal portion extending horizontally away from the dielectric fin structure in a second direction opposite the first direction.

* * * * *